United States Patent
Coroban-Schramel

(10) Patent No.: US 11,201,579 B2
(45) Date of Patent: Dec. 14, 2021

(54) METHOD OF DIAGNOSING A FAULT IN A MOTOR CIRCUIT

(71) Applicant: ZF Automotive UK Limited, Solihull (GB)

(72) Inventor: Vasile Coroban-Schramel, Warwick (GB)

(73) Assignee: ZF Automotive UK Limited

(*) Notice: Subject to any disclaimer, the term of this patent is extended or adjusted under 35 U.S.C. 154(b) by 77 days.

(21) Appl. No.: 16/878,741

(22) Filed: May 20, 2020

(65) Prior Publication Data

US 2020/0373872 A1   Nov. 26, 2020

(30) Foreign Application Priority Data

May 22, 2019 (GB) .................................. 1907232

(51) Int. Cl.
*H02P 29/024* (2016.01)
*G01R 31/34* (2020.01)

(52) U.S. Cl.
CPC ........ *H02P 29/0243* (2016.02); *G01R 31/343* (2013.01)

(58) Field of Classification Search
CPC ...... H02P 29/0243; H02P 21/22; H02P 27/08; H02K 11/20

USPC ................................................ 318/490, 34
See application file for complete search history.

(56) References Cited

U.S. PATENT DOCUMENTS 8,497,651 B2* 7/2013 Tang ................. H02H 7/09
318/474
2013/0106331 A1  5/2013 Guzelgunler

FOREIGN PATENT DOCUMENTS

JP   2006238688 A   9/2006

* cited by examiner

*Primary Examiner* — David Luo
(74) *Attorney, Agent, or Firm* — Robert James Harwood

(57) ABSTRACT

A method of diagnosing an open phase fault condition comprising the steps of: determining the q axis motor current in the motor, the motor speed, the q axis motor current demand, and the demanded phase voltage from the controller and outputting a signal indicative of that an open phase fault condition of motor is present when the following conditions are met: (1) the q axis current demand amplitude is above a threshold; (2) the q axis motor current is below a first predefined fraction of the demanded q axis motor current; (3) the demanded phase voltage is greater than a second predefined fraction of the saturated phase voltage value of the motor circuit; and (4) the motor speed is below a threshold speed.

4 Claims, 6 Drawing Sheets

METHOD OF DIAGNOSING A FAULT IN A MOTOR CIRCUIT

CROSS-REFERENCE TO RELATED APPLICATION

This application claims priority to UK Patent Application No. 1907232.1 filed May 22, 2019, the disclosure of which is incorporated herein by reference in its entirety.

BACKGROUND

This present disclosure relates to improvements in methods of diagnosing a fault condition in an electric motor circuit, in particular, an open phase in a multi-phase electric motor.

Many types of electric motor are known, one example popular for use in automotive applications and elsewhere being the brushless DC synchronous motor. This type of motor has typically three, but can have more than three, phases each formed from separate windings that are typically connected at a common point. Current can flow into or out of each phase through the common point depending on the voltage applied at any time to each of the phases. Each phase may be driven by applying a pulse width modulated voltage waveform to each phase. These waveforms are typically synthesized from a DC source, such as a 12 volt battery, using an inverter circuit which has for each phase a top switch and a bottom switch that selectively connect the phase to a positive side or ground side of the DC battery source. This allows each phase to be driven with a waveform that approximates that which would be achieved by connecting the phase to an AC waveform. In a general case each of the three phases may be driven with a sinusoidal waveform that has the same amplitude and period as the remaining phases but is out of phase with the waveform used for the other phases by 120 degrees.

To control the motor when using PWM modulation the position of the motor rotor must be measured or otherwise calculated. This allows the correct phasing of the PWM sinusoidal signals to be determined. For the most accurate control of the motor it is known to compare a demanded motor current with the actual or estimated current flowing in the motor to give an error signal that is input to a PI controller. The controller outputs the individual voltages required for each motor phase to drive the error term to zero or as close as possible to zero. Whilst PI controllers are the most commonly used in automotive applications other forms of controller can be provided including PD and PID controllers. The term controller hereinafter is used to cover all types of controller that operate by driving an error term to a minimum to give precise control of a motor.

It is known to provide in each phase of the motor, or in all but one of the phases, an isolating switch which is normally closed to permit current to flow in the phase in normal operation but which can be opened during certain fault conditions to prevent current flow. This is useful in ensuring that a closed loop cannot form around the motor phases around which current can flow when the motor is in a generating mode, as this would likely produce a braking torque that would stop the motor from spinning freely. In an application such as electric power steering where a motor applies an assistance torque it could be dangerous for a motor to generate a braking torque in a fault condition as it may make turning the steering wheel too difficult for the driver.

Solid state switches are most suited to use in both the inverter and for these additional normally closed isolating switches as they are highly reliable due to the absence of moving parts, can open rapidly and handle relatively high currents without damage. However, they can fail in an open condition. When this occurs at a time when the motor should be operating normally the motor phase is said to be at fault in an open phase condition. No current can flow through the open phase and so the motor will typically vibrate due to imbalanced currents in the remaining unfaulted phases.

It is therefore desirable to detect an open phase fault when it occurs. The motor can then be operated in a fault mode and the fault can be flagged for investigation. The detection of an open phase condition can be achieved using a diagnostic technique in which samples of the motor current flowing in a phase are taken periodically and in the event that they show that no current has flown over a number of sequential samples a fault can be flagged as this suggests that there is no current flowing. Multiple samples must be taken because any one sample could accidentally coincide with the zero crossing time of the sinusoidal current waveform flowing in the phase when it is operating normally.

SUMMARY

The applicant has appreciated that this simple approach to fault diagnosis may give false results in some instances, in particular when the motor is rotating at a slow speed and with low torque. In this condition, the PWM waveforms applied to each phase of the motor will have a relatively low frequency and a large number of samples may be taken when the current is dose to a zero crossing. This will results in samples being taken which will all show a zero or close to zero current suggesting an open phase but this is incorrect.

An object of the present disclosure is to provide a robust method of diagnosing an open phase fault condition of a multi-phase motor.

According to a first aspect the present disclosure provides a method of diagnosing an open phase fault condition of a motor in a motor circuit of the kind comprising an electric motor, an inverter bridge that applies pulse width modulated sinusoidal current waveforms to each phase, and a controller which receives as an input an error signal dependent on different between the current demanded from the motor Idq and the actual current flowing in the motor idq and outputs a voltage demand signal for each phase of the motor that is fed to the inverter, in which the method comprises determining the q axis motor current in the motor, the motor speed, the q axis motor current demand, and the demanded phase voltage from the controller and in the event that the following 4 conditions are satisfied output a signal indicative of that an open phase fault condition of motor is present: (1) the q axis current demand amplitude is above a threshold; (2) the q axis motor current is below a first predefined fraction of the demanded q axis motor current; (3) the demanded phase voltage is greater than a second predefined fraction of the saturated phase voltage value of the motor circuit; and (4) the motor speed is below a threshold speed.

The demanded phase voltage may be calculated as:

$$V_{dq} = \sqrt{V_d^2 + V_q^2}$$

Where Vd is the output voltage of the d-axis current controller and Vq is the output of the q-axis current controller. Vdq is in the same time the demand for one phase.

The applicant has appreciated that monitoring of these conditions provides a more robust method of detecting an open phase than the prior art methods. At low speeds the controller should be able to track the q axis current very well requiring a small voltage demand from the controller to the inverter, but when an open phase is present the error will increase and the voltage demand will saturate as full voltage is typically demanded in an attempt to reduce the error. The method of the present disclosure enables faults at zero and near zero speeds and currents to be reliably detected.

The method can identify that an open phase fault condition of one phase is present but cannot without further processing of signals determine which phase has the fault. For many motor circuits it is sufficient to identify that a fault is present without knowing which phase is at fault. In most applications it is more important to detect the fault quickly rather than knowing precisely where the fault is and with a much longer detection time.

The threshold for the current demand may be set through tuning as it will vary depending on the motor circuit it is applied to. The first predefined fraction may be different to second predefined fraction or could be the same. Preferably the first predefined fraction is ¾ and the second predefined fraction is 9/10ths. The second predefined fraction may be 10/10ths, so that the voltage has to be fully saturated for the condition to be met.

The method may comprise obtaining the required measurements (q-axis current and so on) by capturing samples of those measurements periodically, for example at regular time intervals as the motor is being operated. By sampling we mean receiving values corresponding to a set moment in time, or which can be extrapolated to provide values corresponding to a set moment in time. These may be digitized values. The different measurements used to check that the condition is met may be obtained at the same moment in time, or by extrapolation may correspond to the same moment in time, so that each time a d axis current sample is obtained the corresponding motor rotor position, d axis error term and motor speed are sampled to form a sample set. Each time a set of captured samples meets the conditions, a counter may be incremented until a set of captured samples that does not meet the conditions is obtained whereby the counter is reset, the method indicating a fault condition when the counter reaches a threshold corresponding to the predefined number of consecutive samples but otherwise not indicating a fault.

By requiring multiple samples sets to be captured and checked for meeting the conditions the method of the present disclosure will be more robust compared with one that indicates an open phase fault based on one set of samples.

The method may comprise outputting the signal indicative of an open phase fault if the conditions are met when the count reaches at least two or more sample times and preferably 12 samples. The method may further comprise outputting a signal indicative of an open phase fault condition of the phase of the motor when the above conditions are met only when the motor speed is below the threshold speed, and in the event that the motor speed is above the threshold speed the method may output a signal indicative of an open phase fault condition of the phase when a different set of conditions are met.

The method may therefore further comprise, at motor speeds above the threshold speed, sampling the motor q axis current and indicating the open phase fault condition when the value of the motor q axis current sample is zero for a predefined number of sequential samples where the predefined number is at least two and preferably 4 or more samples and where the demanded q axis current is above a threshold non-zero demanded current.

In a further enhancement to the method, the method may further comprise sampling the d axis current error. By this we mean the difference between the actual d axis current in a motor phase and the demanded d axis current. This error will normally be small due to the action of the controller, but when a switch is faulty can become large. Using this a test for a further alternative set of conditions may be performed at low speeds in which an open phase fault in a phase is indicated in the event that: (1) The average d axis current error over a predefined number of sequential samples is above a threshold; (2) the phase current is zero; and (3) the rotor position is outside a certain range corresponding to a zero crossing. Using the above method and by sampling the d axis current and q axis currents for individual phases, it is possible to identify which phase is at fault.

According to a second aspect the present disclosure provides in combination an electric motor circuit and a motor diagnostic circuit for use in combination with the electric motor circuit, in which the electric motor circuit comprises: an electric motor, an inverter bridge that applies pulse width modulated sinusoidal current waveforms to each phase, and a controller which receives as an input an error signal dependent on different between the current demanded from the motor Idq and the actual current flowing in the motor idq and outputs a voltage demand signal for each phase of the motor that is fed to the inverter, And in which the motor diagnostic circuit comprises a signal processor, a memory and a set of programming instructions which when executed on the signal processor cause the processor to carry out the method of the first aspect of the present disclosure.

The signal processor may receive samples of the required measurements used by the model. The motor circuit may include a current measuring circuit which measures the current in the motor, or a current estimator which determines the current without direct measurement. A position sensor may be provided as part of the motor circuit and this may be used by the current measuring circuit.

BRIEF DESCRIPTION OF THE DRAWINGS

There will now be described by way of example only one embodiment of the present disclosure with reference to and as illustrated in the accompanying drawings of which.

DETAILED DESCRIPTION

Figure 1:
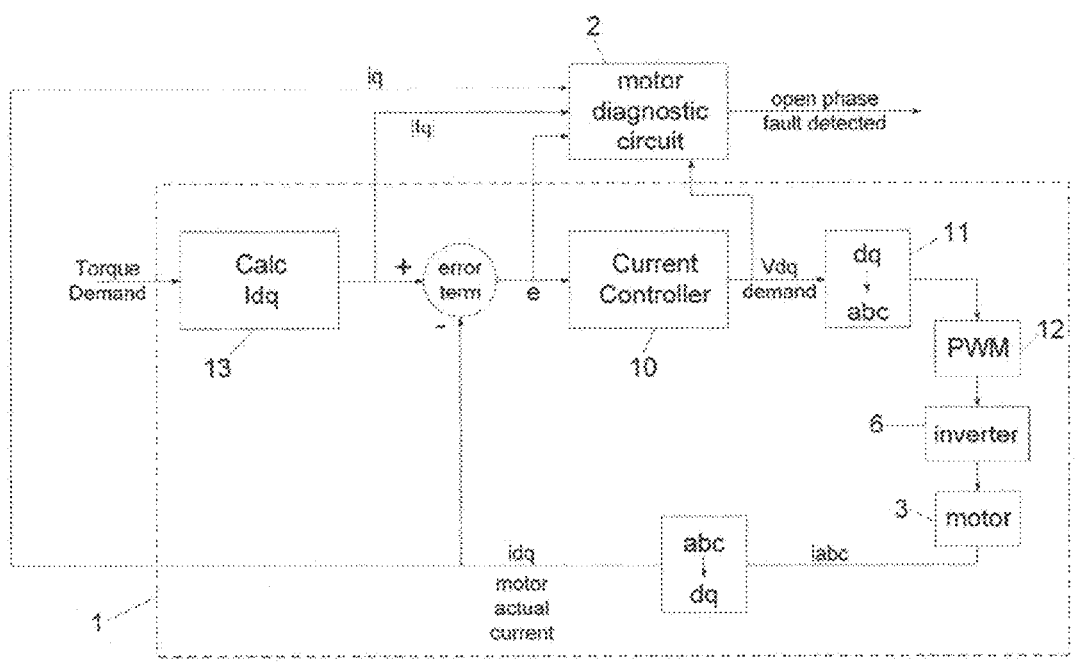
FIG. 1 is a block diagram of the key components of an exemplary motor circuit in combination with a motor diagnostic circuit.

FIG. 1 shows an exemplary embodiment of a motor circuit 1 in combination with a motor diagnostic circuit 2 in accordance with an aspect of the present disclosure.

Figure 2:
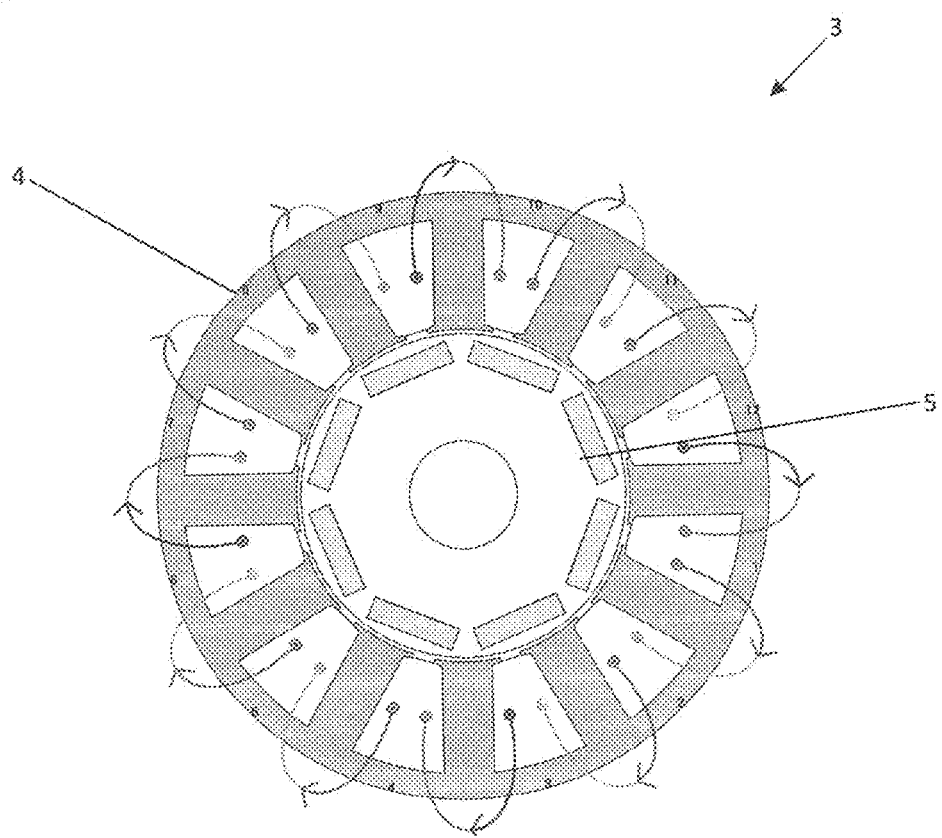
FIG. 2 is a view of an example motor of the circuit of FIG. 1.

The motor circuit 1 comprises a brushless DC three phase electric synchronous motor 3. An example of such a motor 3 is shown in FIG. 2. The motor 3 may for example comprise a three phase wound stator element 4 and a rotor 5 having for example six embedded magnets within it which in this instance are arranged so as to provide six poles which alternate between north and south around the rotor. The rotor therefore defines three direct or d axes evenly spaced around the rotor and three quadrature or q axes interspaced between the d axes. The d axes are aligned with the magnetic poles of the magnets where the lines of magnetic flux from the rotor are in the radial direction, and the q axes are spaced between the d axes where the lines of magnetic flux from the rotor are in the tangential direction. In general current aligned with the q-axis generates motor torque and current aligned with the d-axis does not.

The stator has six poles wound as three pairs, each pair defining one of three motor stator windings for phases a, b and c. The phases are connected in a star network.

Figure 3:
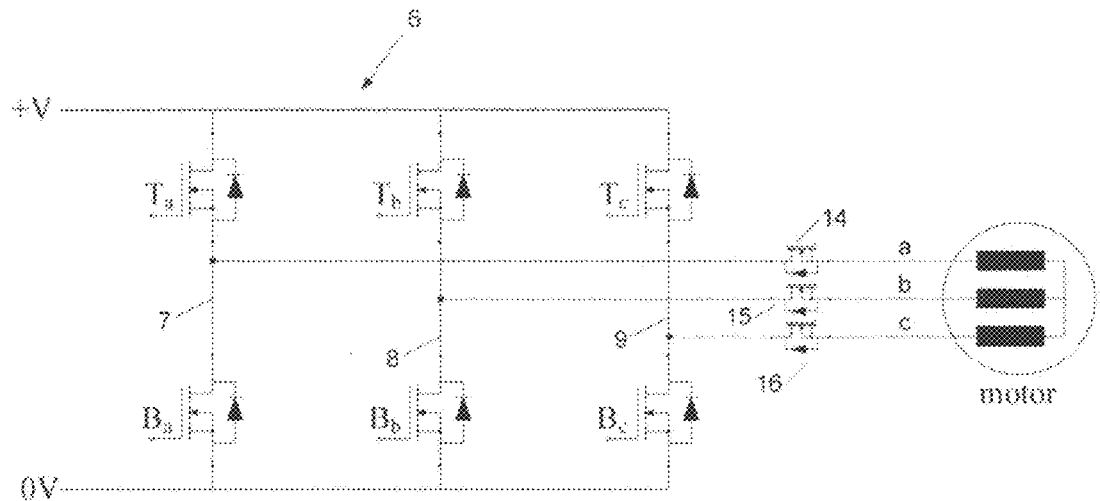
FIG. 3 is a view of the motor inverter connected to the motor phases and showing an isolation switch in each phase.

The free ends of the phase windings are connected to an inverter bridge 6 forming a switching stage of the motor circuit 1. This is shown in FIG. 3. Each arm 7, 8 and 9 of the inverter 6 comprises a pair of switches Ta, Ba; Tb, Bb and Tc, Bc in the form of a top transistor and a bottom transistor connected in series between the battery supply rail +V and ground line 0v. The motor windings are each tapped off from between a respective complementary pair of transistors. The transistors are turned on and off in a controlled manner in response to an output voltage demand signal Vdq from a PI controller. This is typically a dq voltage demand. A voltage converter block 11 converts the d-q demand voltage output from the current controller into three voltage demand components in a static reference frame Va,b,c, one for each phase of the motor a, b or c. These individual phase demand voltages are then converted by a drive circuit 12, into suitable PWM signals that are supplied to the switching motor phases by PWM of the switches. A range of PWM switching strategies are known in the art and so will not be described in detail here. The switch arrangement is well known and described in such documents as EP 1083650A2.

The motor controller 10 in this example is a conventional PI controller. At the input to the controller an error signal e is applied which is formed by comparing a demanded dq motor current, Idq, with the actual current iDQ flowing in the motor. The primary function of the PI controller 10 is to drive the error term e to a low or ideally zero value.

The dq current demand in this example is generated by feeding a motor torque demand signal into a block 13 that calculates the appropriate current demand Idq for the motor 3 needed to generate the demanded torque. This will depend on the motor parameters and the voltage available to the inverter.

The motor circuit 1 also includes an isolation switch 14, 15, 16 in each phase of the motor 3, located in this example between the inverter 6 and the motor windings. Each switch 14, 15, 16 comprises a solid state switch which is normally closed to allow current to flow through the switch and the motor phase. The switch 14, 15, 16 may be opened under control of a safety manager, not shown, whenever it is deemed necessary to isolate the motor phase. Typically this will be done if a fault of the inverter is detected, and this prevents unwanted currents flowing through the motor.

Although reliable, the isolation switches 14, 15, 16 may fail in an open condition, preventing the flow of current through the motor 3 which will limit or completely prevent the motor 3 from providing the required torque. The applicant has appreciated that in practice the motor 3 will eventually stall when an open phase fault condition of one phase has occurred and the motor may vibrate regardless of the demanded motor speed. This is because of the way the PI controller 10 operates whereby in the fault condition the current demand cannot be fulfilled but the d-axis voltage takes priority and saturates, leaving the q-axis voltage small and oscillating depending on the d-axis voltage error.

A method within the scope of the present disclosure can identify open phase faults under a range of operating conditions.

Figure 4:
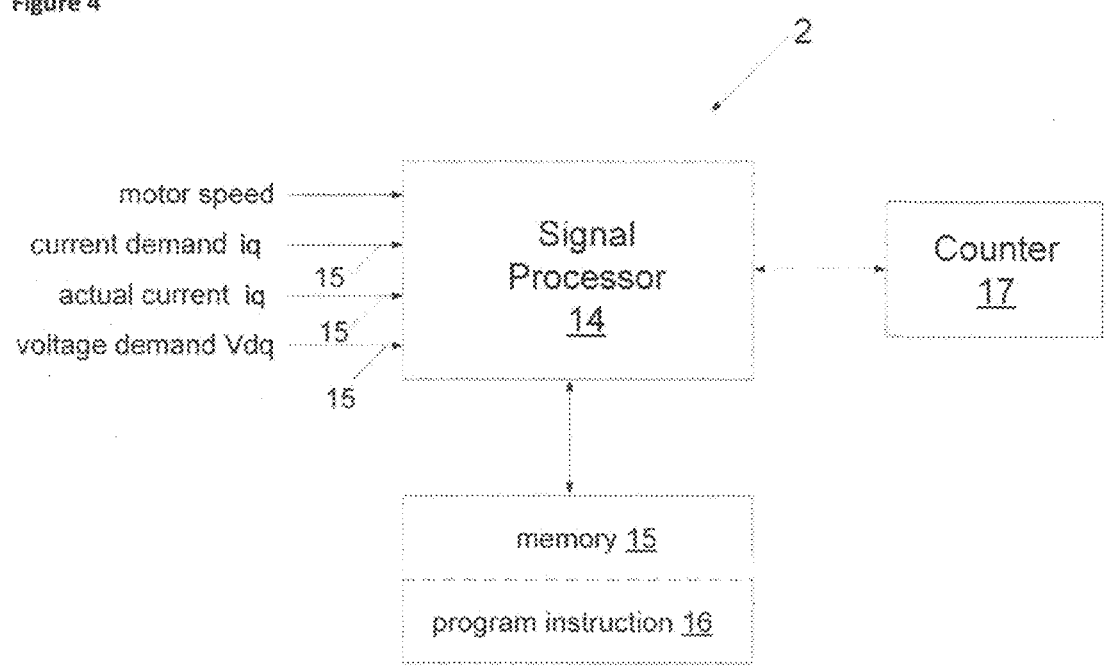
FIG. 4 is detailed view of the functional parts of the zero phase current motor diagnostic circuit.

To detect an open phase fault condition the motor diagnostic circuit 2 is provided. This is shown in more detail in FIG. 4 and comprises a signal processor 14, a memory 15, a set of program instructions 16 stored in the memory for execution by the signal processing means, and a counter 17. The stored instructions are executed whenever the motor circuit 1 is operational so that the motor circuit 1 is being constantly diagnosed. The signal processor 14 receives at a set of input terminals 15 a set of samples of the following measurements: the q axis motor current in the motor iq; the motor speed; the q axis motor current demand, and the demanded phase voltage Vdq from the controller.

Each set of these measurements may be captured at substantially the same instant, and sets may be obtained at regular time intervals. In this example they are captured every few milliseconds, so that a set of samples is produced corresponding to a series of moments in time.

The motor diagnostic circuit operates in two discrete modes. A first mode is used at high motor speeds, and a second at low motor speeds. Each mode is chosen because it has benefits at high speed and low speed respectively. The diagnostic circuit switches between modes in response to the value of the motor speed. In this example the transition from the low speed mode to the high speed mode occurs at 300 rpm, although this will be different for other motor designs. It is set as a function of the PWM period used by the motor drive stage of the circuit.

The method of operation of the motor diagnostic circuit in each of the two modes is explained below.

Figure 5:
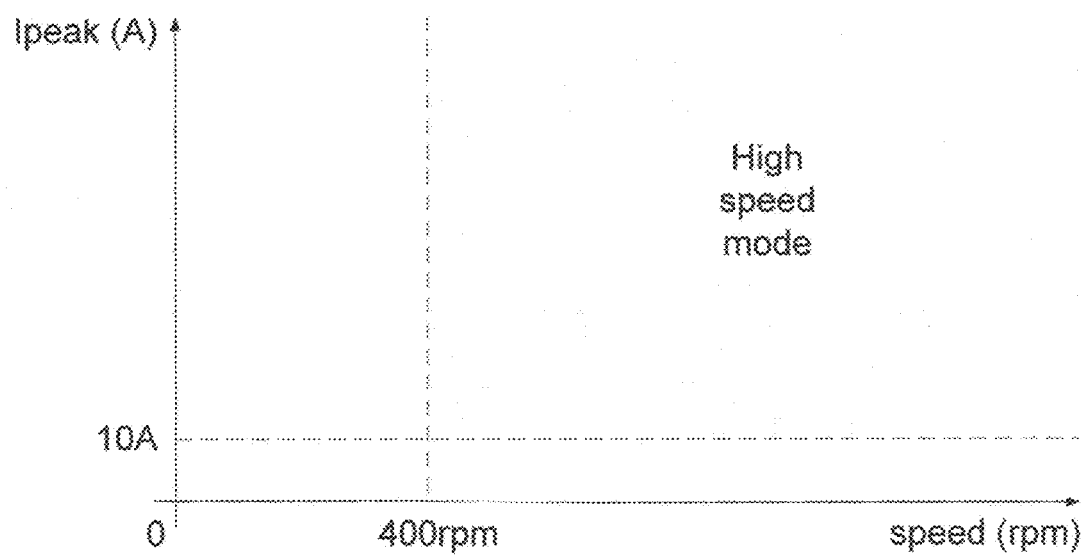
FIG. 5 shows the region of operation of the high speed mode of the motor diagnostic circuit.

High speed mode: In the high speed mode the diagnostic circuit determines that the motor current is above a threshold, in this case 10 Amps, if the q axis current demand is above a threshold and if the average q axis current is above a threshold in this case and also if these conditions are met taking the average over 4 samples an open circuit fault condition is flagged a present. FIG. 5 shows the region of operation of the high speed mode.

Figure 7:
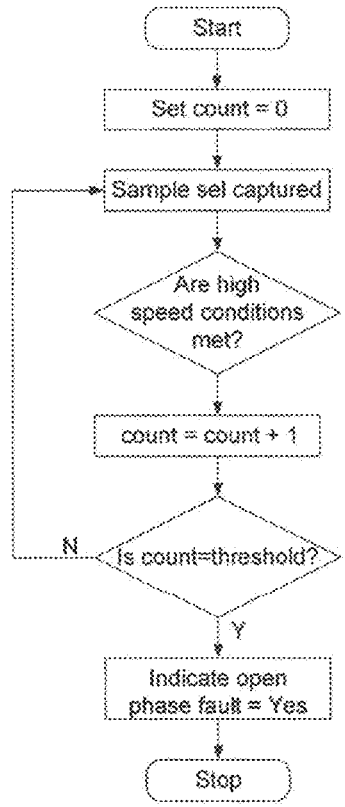
FIG. 7 is a flow chart of the steps performed by the diagnostic circuit in the high speed mode.
Figure 8:
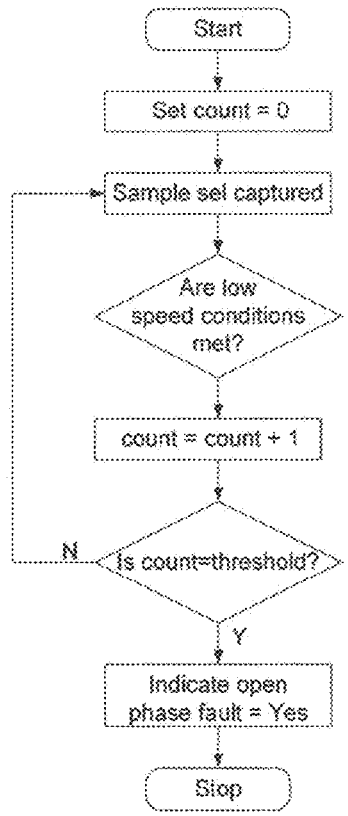
FIG. 8 is a flow chart of the steps performed by the diagnostic circuit in the low speed mode.

The steps carried out in the high speed mode are shown in FIG. 7. Initially a counter is set to zero and at time t=0 a set of samples of each of the measurements is captured. These are then processed to see if the condition is met. If the condition is met the counter is incremented by 1. A check on the value of the counter is then made and if it exceeds a threshold equal to a value of 4 an open fault is indicated. If the condition is not met the counter is reset to 0. The method then loops back to take the next sample set at time t=1, and so on as sample sets are periodically captured.

Figure 6:
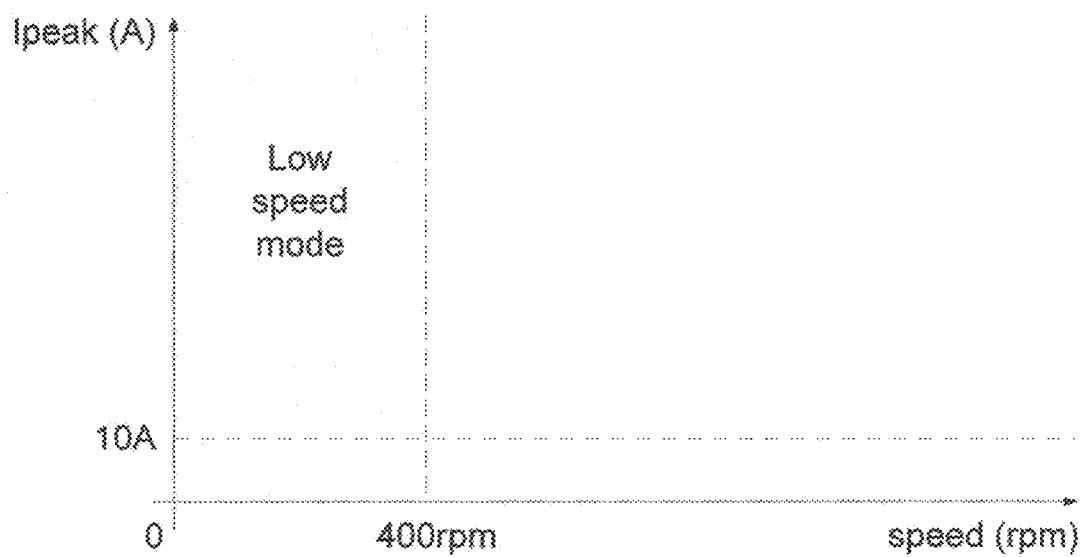
FIG. 6 shows the region of operation of the low speed mode of the motor diagnostic circuit.

Low Speed Mode: At low speeds two different tests are carried, one for very low speed referred to here as a zero speed mode and the other for low but generally higher speeds. The region of operation of the low speed mode is shown in FIG. 6 and the zero speed mode in FIG. 10. The skilled person will understand that the speed thresholds shown are exemplary only and that other limits may be used depending on the motor circuit design.

In the zero speed mode a signal indicative of an open phase fault condition of the motor being present is output if the following 4 conditions are all met: (1) the q axis current demand is above a threshold; (2) the q axis motor current is below a first predefined fraction of the demanded q axis motor current; (3) the demanded phase voltage is less than a second predefined fraction of the saturated phase voltage value of the motor circuit; and (4) the motor speed is below a threshold speed which in this example is 300 rpm.

In this example the threshold for the current demand is the same as for the high speed mode, e.g. 10 Amps, the first predefined threshold is set at 0.75 and the second predefined threshold is set at 0.9. The saturated phase voltage will be determined real time (for example every 200 microseconds) and will be dependent of the battery voltage available to the inverter.

Figure 9:
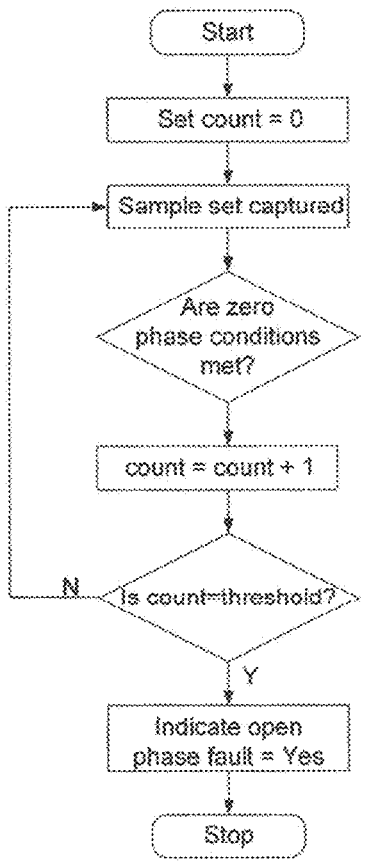
FIG. 9 is a flow chart of the steps performed by the diagnostic circuit in the zero speed mode.
Figure 10:
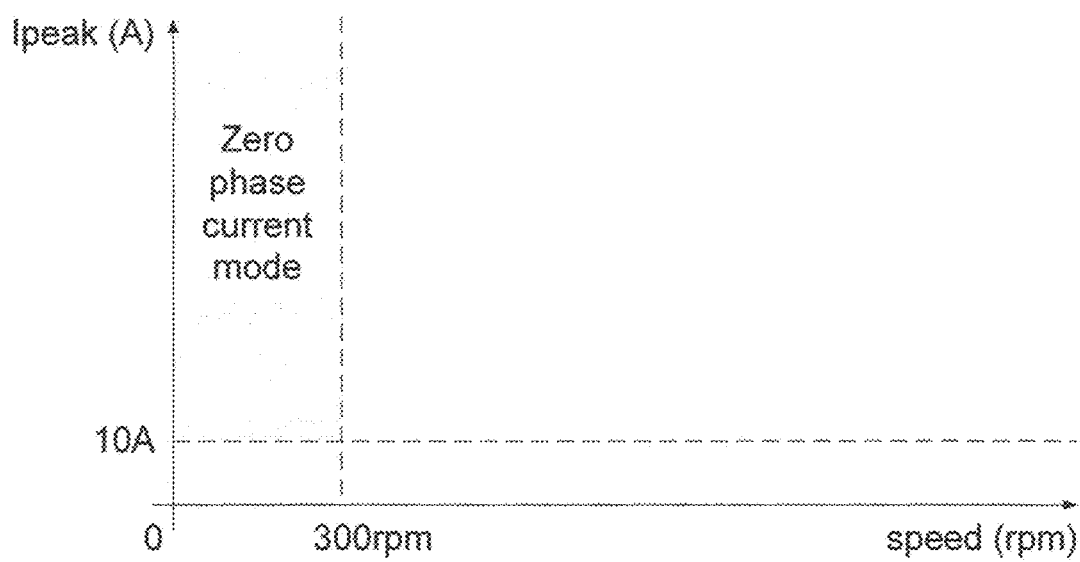
FIG. 10 shows the region of operation of the low speed mode of the motor diagnostic circuit.

FIG. 10 shows the region of operation of the zero speed mode. The steps carried out in the zero speed mode are shown in FIG. 9. Initially a counter is set to zero and at time t=0 a set of samples of each of the measurements is captured. These are then processed to see if the low speed mode condition is met. If the condition is met the counter is incremented by 1. A check on the value of the counter is then made and if it exceeds a threshold equal to a value of 12 an open fault is indicated. If the condition is not met the counter is reset to 0. The method then loops back to take the next sample set at time t=1, and so on as sample sets are periodically captured. In the low speed mode more samples are taken than in the high speed mode because at very low speed for the phase current to travel −1 . . . 1A range can take many milliseconds, therefore more samples are needed. At high speed that milliseconds shrink very much. Example: at 60 rpm, the current needs 8 ms to travel from −1A to 1A.

The zero speed mode described above works effectively even at zero motor speeds as can occur if the motor becomes stuck and is oscillating. However, it cannot identify which phase is at fault when at zero speeds. To determine which phase is stuck at low but non-zero speeds, the method may additionally check to see if the following conditions are met:
—average d axis current error of the last 12 samples is above a threshold, phase current is zero, and the rotor position is outside a certain range corresponding to a zero crossing. This check may be performed for each phase enabling the specific phase that has the open phase fault condition to be identified. This is shown in FIG. 7 of the drawings. The low speed region of operation is shown in FIG. 6 and goes up to 400 rpm in this example.

In practice, the method will constantly test to see if the zero speed conditions and the low speed (non zero current demand) conditions are met. Depending on the timing and nature of the fault, the zero speed test may flag a fault before the low speed test, or the other way round.

What is claimed is:

1. A method of diagnosing an open phase fault condition of a motor in a motor circuit of the kind comprising an electric motor, an inverter bridge that applies pulse width modulated sinusoidal current waveforms to each phase, and a controller which receives as an input an error signal dependent on the difference between the current demanded from the motor Idq and the actual current flowing in the motor idq and outputs a voltage demand signal for each phase of the motor that is fed to the inverter, in which the method comprising the steps of:
   determining the q axis motor current in the motor, the motor speed, the q axis motor current demand, and the demanded phase voltage from the controller and
   outputting a signal indicative of that an open phase fault condition of motor is present when the following conditions are satisfied: (1) the q axis current demand amplitude is above a threshold; (2) the q axis motor current is below a first predefined fraction of the demanded q axis motor current; (3) the demanded phase voltage is greater than a second predefined fraction of the saturated phase voltage value of the motor circuit; and (4) the motor speed is below a threshold speed.

2. The method of claim 1 wherein each of the q axis motor current in the motor, the motor speed, the q axis motor current demand, and the demanded phase voltage from the controller are sampled periodically to form sets of samples, and in which each time a set of captured samples meets the conditions, a counter is incremented until a set of captured samples that does not meet the conditions is obtained whereby the counter is reset, the method indicating a fault condition when the counter reaches a threshold corresponding to the predefined number of consecutive samples but otherwise not indicating a fault.

3. The method according to claim 1 further comprising the steps of:
   periodically sampling the motor q axis current, and
   outputting a signal indicative of that an open phase fault condition of motor in the event that the value of the motor q axis current sample being zero for a predefined number of sequential samples where the predefined number is at least two; and where the demanded q axis current is above a threshold non-zero demanded current corresponding to those samples.

4. The method according to claim 1 further comprising the step of:
   sampling the average d axis current error and outputting a signal indicative of that an open phase fault condition of motor is present in the event that: (1) he average d axis current error over a predefined number of sequential samples is above a threshold; (2) the phase current is zero; and (3) the rotor position is outside a certain range corresponding to a zero crossing.

* * * * *